United States Patent [19]

Sharp

[11] Patent Number: 4,584,492

[45] Date of Patent: Apr. 22, 1986

[54] TEMPERATURE AND PROCESS STABLE MOS INPUT BUFFER

[75] Inventor: Patrick O. Sharp, Aptos, Calif.

[73] Assignee: Intel Corporation, Santa Clara, Calif.

[21] Appl. No.: 637,884

[22] Filed: Aug. 6, 1984

[51] Int. Cl.[4] .............................................. H03K 17/30
[52] U.S. Cl. ................................. 307/475; 307/443;
 307/496; 307/297; 307/310
[58] Field of Search ............... 307/443, 448, 451, 475,
 307/491, 496, 497, 359, 362, 568, 577, 579, 585,
 264, 297, 310; 330/277, 289

[56] References Cited

U.S. PATENT DOCUMENTS

| | | | |
|---|---|---|---|
| 4,110,641 | 8/1978 | Payne | 330/277 X |
| 4,199,693 | 4/1980 | Bennett | 307/297 X |
| 4,258,272 | 3/1981 | Huang | 307/475 |
| 4,410,813 | 8/1983 | Barker et al. | 307/297 X |
| 4,430,582 | 2/1984 | Bose et al. | 307/475 X |
| 4,437,024 | 3/1984 | Wacyk | 307/475 |

FOREIGN PATENT DOCUMENTS 2549308  7/1976  Fed. Rep. of Germany ...... 307/251

Primary Examiner—Stanley D. Miller
Assistant Examiner—D. R. Hudspeth
Attorney, Agent, or Firm—Blakely, Sokoloff, Taylor & Zafman

[57] ABSTRACT

A MOS integrated circuit buffer which operates over a wide temperature range particularly suited for receiving a TTL signal over the range of −55 degrees C. to 155 degrees C. even with expected process variations. A compensated reference potential is developed in a feedback circuit. This reference potential is used to provide compensation to a buffer section which has substantially identical characteristics to the feedback circuit. The trigger point of the buffer section is thus maintained at the reference potential.

15 Claims, 4 Drawing Figures

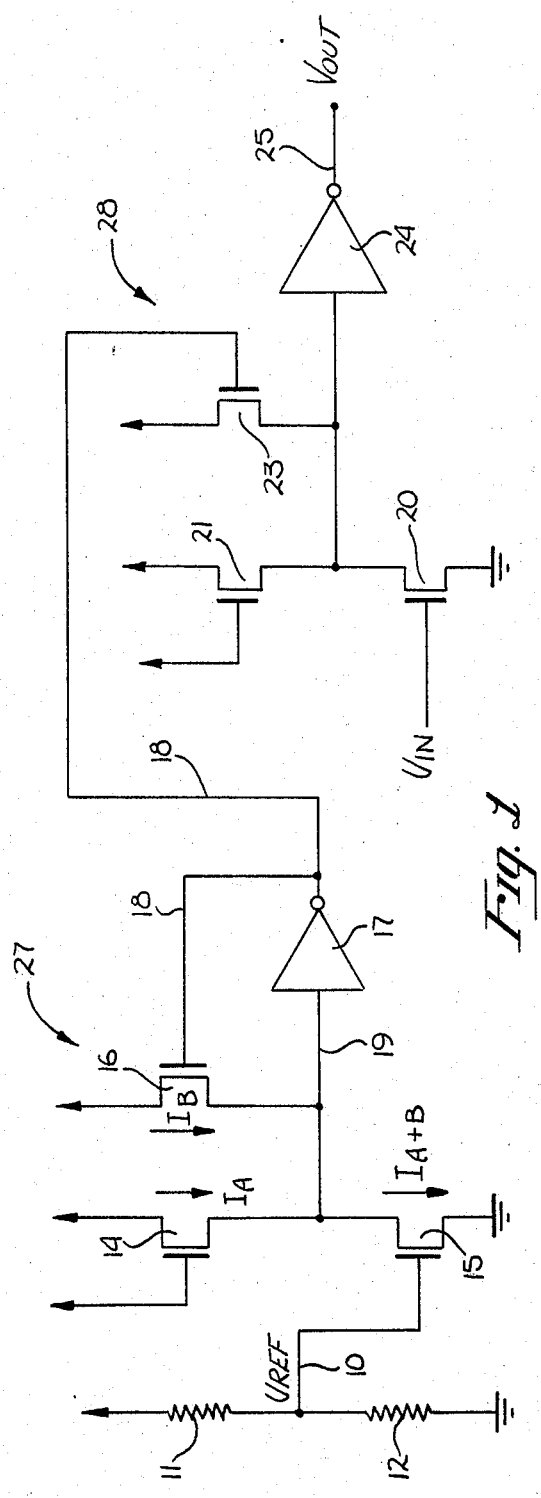
Fig. 1
Fig. 2
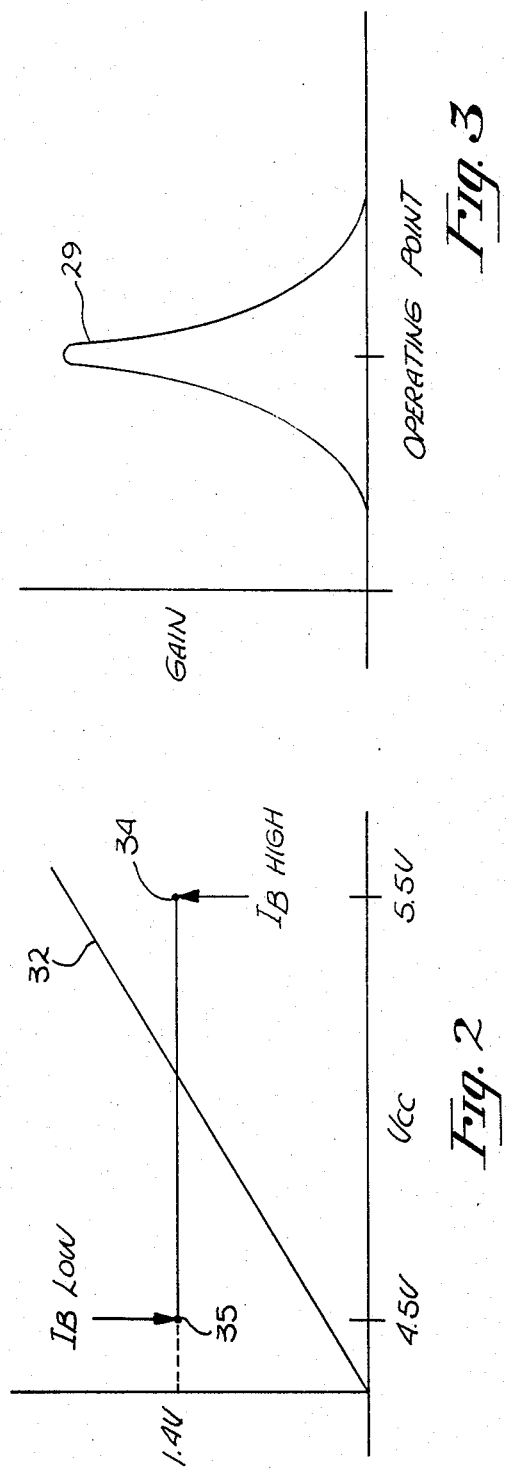
Fig. 3

TEMPERATURE AND PROCESS STABLE MOS INPUT BUFFER

BACKGROUND OF THE INVENTION

1. Field of the Invention.

The invention relates to the field of metal-oxide-semiconductor (MOS) buffers.

2. Prior Art.

There are numerous circuits used in MOS integrated circuits for input buffering. In a typical application, a buffer receives an input signal such as address, data or control signals, and converts it from the input level to an MOS level. Most commonly, TTL level signals (e.g., 0.8 and 2.0 volts) are converted to MOS level signals (e.g., 0 and 5 volts). Other conversions are also used such as from ECL to MOS levels.

The characteristics of MOS circuits vary greatly with temperature. MOS circuit characteristics also vary within a given process, and indeed, two die spaced-apart on the same wafer can have transistors with considerably different threshold voltages. For some applications, circuits must operate over a wide temperature range such as −55 degrees C. to 125 degrees C. In fact, the internal temperature of the integrated circuit may be as high as 155 degrees C. when the circuit operates in an environment of 125 degrees C. Under these stressful temperatures, the circuit must also operate with power supply variations in the range of 10%. Buffers as well as other MOS circuits in some applications must be designed to operate over this wide temperature range. This is difficult to achieve particularly because of the process variations.

Most MOS buffers use inverters in a variety of arrangements. These buffers have poor temperature and process variation characteristics. Other MOS buffers use a differential sensing arrangement where a reference potential is compared to the input signal. These buffers have substantially better temperature characteristics; however, they are relatively slow and consume considerable power. Prior art MOS buffers are shown in U.S. Pat. Nos. 4,048,518 and 4,437,171; ISSCC81, Digest of Technical Papers, pages 17 and 21; and ISSCC82, Digest of Technical Papers, pages 249 and 257.

In a search conducted for Applicant on the "feedback" arrangement used in the present invention, three patents were uncovered. U.S. Pat. No. 4,199,693 is of only general interest. U.S. Pat. No. 4,430,582 discloses a buffer circuit with feedback and a compensated reference potential. One disadvantage to this circuit is that current is drawn from the compensated reference potential circuit, unlike the present invention. U.S. Pat. No. 4,410,813 discloses a different circuit arrangement which Applicant believes is not as responsive to environmental changes as the present invention.

As will be seen, the present invention discloses an MOS input buffer which is substantially insensitive to temperature variations and processing variations. In the preferred embodiment, the buffer operates successfully over a temperature range of −55 degrees C. to 155 degrees C. The invented buffer is relatively fast and of low power.

SUMMARY OF THE INVENTION

An MOS integrated circuit buffer for sensing an input signal which varies above and below a reference potential is described. A first circuit, which in the presently preferred embodiment comprises an inverter, is coupled to receive the reference potential and provides a buffered reference potential. A first amplifier receives the buffered reference potential at its input terminal; in the presently preferred embodiment, this amplifier is an inverter. A feedback path couples the output of the first amplifier to the first circuit and amplifier input to cause the buffered reference potential to maintain the first amplifier in a predetermined operating region such as maximum gain or linear regions. The first amplifier thus provides a compensated reference potential. A second circuit substantially identical to the first circuit is coupled to receive the input signal (e.g., TTL signal) and provides a buffered input signal. A second amplifier is coupled to receive this buffered input signal. An electrical path couples the compensated reference potential to the second circuit and second amplifier in the same manner as the feedback path couples the output of the first amplifier to the first circuit and amplifier. In effect, the compensated reference potential holds the second circuit and second amplifier in the identical operating regions as the first amplifier and first circuit. Since the entire buffer is fabricated on the same die, the first and second circuits and first and second amplifiers have substantially identical characteristics. The second circuit and second amplifier "trip" at precisely the reference potential. The transistors in the first circuit and feedback path are selected so that the trip point remains within, for instance, the TTL voltage range over a wide temperature range and process variations.

BRIEF DESCRIPTION OF THE DRAWINGS

FIG. 1 is an electrical schematic of a buffer built in accordance with the present invention.

FIG. 2 is a graph used to describe the manner in which the size of certain transistors used in the buffer of FIG. 1 are selected.

FIG. 3 is a graph used to describe the operation of an amplifier (inverter) used with the present invention.

DETAILED DESCRIPTION OF THE PRESENT INVENTION

Figure 4:
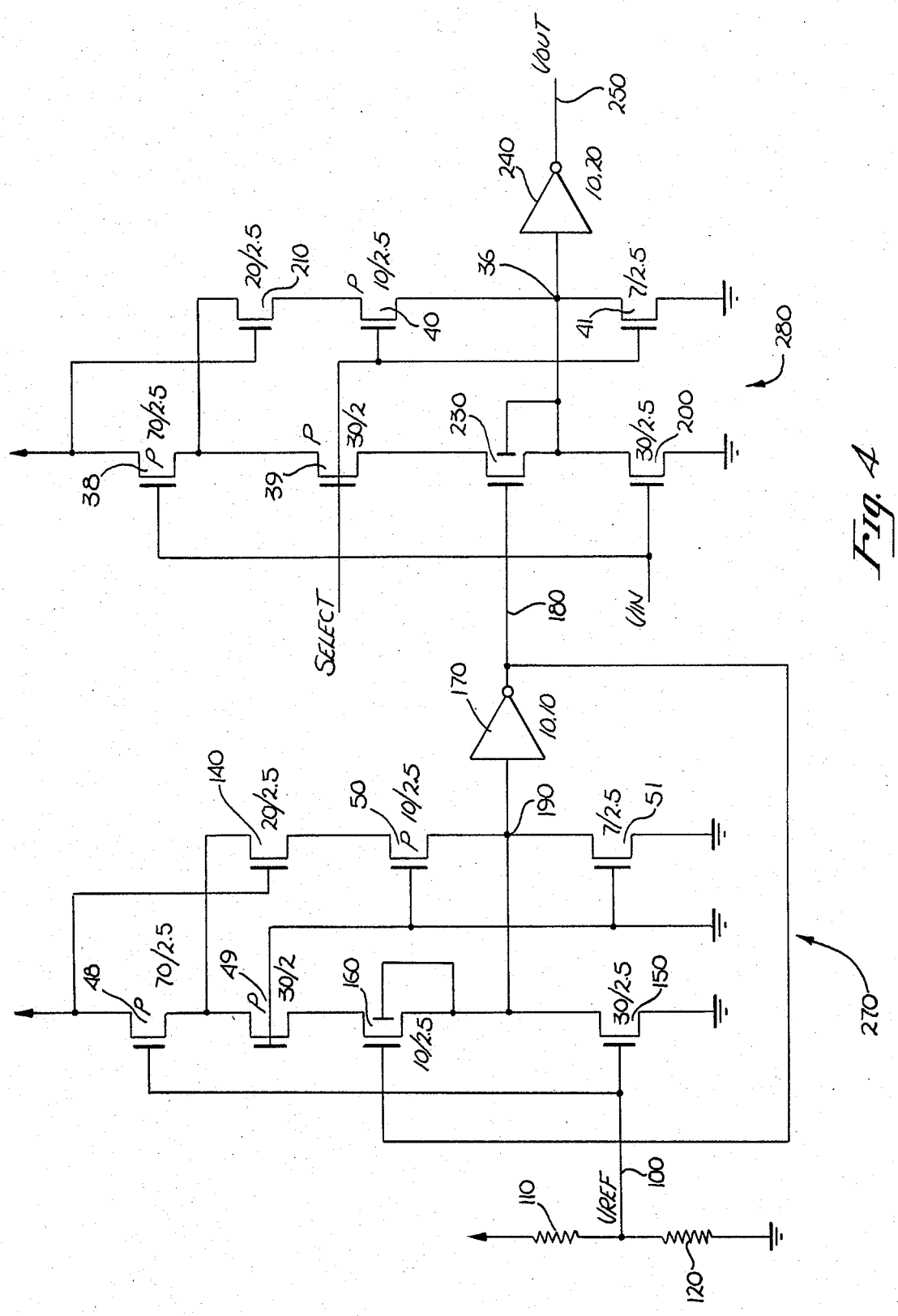
FIG. 4 is an electrical schematic of the presently preferred embodiment of the present invention.

An integrated circuit metal-oxide-semiconductor (MOS) buffer is described. In the following description, numerous specific details such as transistor sizes are set forth in order to provide a thorough understanding of the present invention. It will be obvious to one skilled in the art that the present invention may be practiced without these specific details. In other instances, well-known processing, circuit components, etc., are not set forth in detail in order not to unnecesarily obscure the present invention.

In the presently preferred embodiment, the MOS buffer is fabricated on a monocrystalline silicon substrate as part of a complementary MOS memory. The present invention is not dependent on any particular MOS processing and thus, may be fabricated employing numerous well-known CMOS processes, NMOS processes or other processes. In the currently preferred embodiment, an n-type substrate is used with the n-channel transistors being fabricated in p-type wells. The field-effect transistors use polysilicon crystalline gates.

The buffer of FIG. 1 is divided into two sections, 27 and 28. The section 27 receives a reference potential on line 10 and provides a compensated reference potential on line 18 to the section 28. Buffer section 28 receives the input signal (e.g., TTL level signal) at the gate of transistor 20 and provides an MOS level signal (e.g., 0 or 5 volts) on line 25. In the currently preferred embodiment, the compensated reference potential on line 18 is distributed over the die to all the buffers represented by buffer section 28. The line 18 is routed (not in a direct path) throughout the peripheral area of the chip to take advantage of filtering effect of a long line.

In the presently preferred embodiment, the reference potential on line 10 is 1.4 volts, this being midway between the low level TTL input of 0.8 volts and the high level TTL input of 2.0 volts. Two resistors 11 and 12 are fabricated on the substrate and coupled to the circuit's power supply to provide the nominal 1.4 volts on line 10 from the resistive voltage divider. P-wells in the substrate are used for forming the resistors 11 and 12.

The reference potential on line 10 obviously varies with the power supply potential. If the power supply potential varies no more than ±10%, satisfactory TTL operation is obtained from the buffer of FIG. 1 over the entire temperature range of −55 degrees C. to +155 degrees C. and with expected process variations. The source of the reference potential on line 10 is not critical to the present invention and, for instance, an on-chip temperature compensated circuit may be used to provide the reference potential or an externally generated reference potential may be used.

The reference potential is coupled to a first circuit, comprising transistors 14 and 15. These series coupled transistors form an ordinary inverter wth a gate of transistor 15 receiving the reference potential and the gate of transistors 14 being coupled to the power supply potential. The buffered reference potential on line 19 is coupled to an MOS inverter 17. As will be discussed, the inverter 17 operates as an amplifier. The output of inverter 17 is fed back through line 18 to the gate of transistor 16. The current through transistor 16 effects the buffered reference potential on line 19 as will be described.

Transistors 20, 21, and 23 of buffer section 28 are identical to transistors 15, 14 and 16, respectively. Transistor 23 effects the input to the inverter 24 in the same manner as transistor 16 effects the input to inverter 17. The inverters 17 and 24 have substantially the same characteristics and may be identical. In the presently preferred embodiment, transistor 24 employs different size inverter as will be seen from FIG. 4 in order to increase the speed of buffer section 28.

For the embodiment of FIG. 1, all the transistors are n-channel, enhancement mode transistors. For the embodiment of FIG. 3, p-channel transistors are added to the circuit primarily to permit selection and deselection of the buffer sections 28 to reduce standby current.

The transistors 14, 15 and 16 maintain the potential on line 19 such that the inverter 17 remains at its "trigger" or "trip" point. This corresponds to the maximum gain operating point of the inverter 17 as shown by region 29 in FIG. 3. In this region the inverter has linear characteristics. (A gain of approximately 15 is realized in the presently preferred embodiment.) The feedback which controls the current through transistor 16 ($I_B$) provides the control of the potential on line 19. The current through transistor 14 ($I_A$) and the characteristics of transistor 15 vary as a function of temperature and process variations, and thus $I_A$ is not constant.

Referring to FIG. 2, line 32 is used to demonstrate the potential that would occur on line 19 without transistor 16. The characteristics of the inverter formed by transistors 14 and 15 would change dramatically over different conditions such as power supply potential. With the present invention the sizes of transistors 14, 15 and 16 are selected to maintain the potential on line 19 at the trip point of inverter 17. If one extreme case is first considered, specifically high temperature and low power supply potential, the potential on line 18 is low, transistor 16 is off or only slightly conducting, transistor 14 is slightly conducting, and in effect, transistor 15 determines the trip point with its threshold voltage. For this condition, $I_B$ is approximately 20% of the current through transistor 15. This is shown as point 35 in FIG. 2. At the other extreme, low temperature and high power supply potential transistor 14 conducts heavily, the potential on line 18 is high, and transistor 16 conducts heavily. The current through transistor 15 is, of course, the sum of the current through transistors 14 and 16 and at this extreme condition, approximately half the current through transistor 15 if $I_B$ (point 34 of FIG. 2).

The sizes of transistors 14, 15 and 16 are selected to provide the flat temperature response shown in FIG. 2. The specific sizes for the transistors 14, 15 and 16 are shown in FIG. 4. The ratio of the sizes are 1, 3, and 2 for transistors 14, 15 and 16, respectively. In the presently preferred embodiment, the potential on line 18 varies between 2.5 volts to 3.5 volts over the entire temperature and power supply voltage range.

Transistors 21, 20 and 23, as mentioned, are identical to transistors 14, 15 and 16, respectively. Since these transistors are fabricated on the same die, all transistors of a given size will have substantially identical characteristics. If the reference potential on line 10 is precisely 1.4 volts, and the input potential to transistor 20 is also 1.4 volts, the magnitude of the current flowing through transistor 23 will be identical to the current flowing through transistor 16. The trip point of the inverter 24 will likewise be precisely the same as the trip point of inverter 17. A potential greater than 1.4 volts applied to the gate of transistor 20 will cause a high output on line 25 and a potential less than 1.4 volts to transistor 20 causes a low output on line 25. Over the entire temperature range, the trigger point of inverter 24 remains precisely at the reference potential on line 10. The feedback on line 18 compensates for the temperature changes and process variations, causing the inverter 17 to remain at its trigger point. As previously mentioned, ideally the inverters 17 and 24 should be identical, but the benefit obtained from this identity is sacrificed to make buffer section 28 faster.

While in the embodiment of FIG. 1, inverters 17 and 24 are used, the same results can be obtained with two operational amplifiers used instead of these inverters. Moreover, while in the current realization inverter 17 has more gain than the inverter comprising transistors 14 and 15, even better operation can be achieved if the gain of these two inverters were more equal to the gain of inverter 17.

Referring to FIG. 4, the buffer again includes two sections, section 270 which corresponds to section 27 of FIG. 1 and section 280 corresponding to section 28 of FIG. 1. The transistors, resistors, inverters and nodes of FIG. 1 all have corresponding parts in FIG. 4; a zero has been added to the number of FIG. 1 to identify the corresponding part in FIG. 4. For instance, transistors 14, 15 and 16 are shown as transistors 140, 150 and 160 in FIG. 4. Similarly, line 18 is shown as line 180. The circuit of FIG. 4 operates in an identical manner to the circuit of FIG. 1, except that several transistors have been added to allow buffer section 28 to be selected and deselected. In a typical memory, since the input buffers are not in continuous use, they are powered down when not in use to reduce power consumption.

The p-channel transistors 38 and 39 are coupled in series between the power supply and the feedback transistor 230. The gate of transistor 38 is coupled to the input line and the gate of transistor 39 is coupled to a select line. A p-channel transistor 40 is coupled in series with the n-channel transistor 210. The gate of transistor 40 is coupled to receive the select signal. An n-channel transistor 41 couples the input of the inverter 240 to ground when the buffer is not selected.

When the buffer is selected, the select line is coupled to ground causing transistors 39 and 40 to freely conduct. For this condition, transistor 41 presents a very high impedance permitting a signal to flow to the input of the inverter 240. Transistor 38 is relatively large when compared to transistors 200 and 230 and hence, its characteristics do not substantially effect the operation of the circuit as described for FIG. 1. When a positive potential is applied to the select line (e.g., 5 volts) current is prevented from flowing through transistors 200, 210, and 230 and additionally, the input to buffer 240 is coupled to ground through transistor 41. This prevents power from being dissipated from section 280 of the buffer. Otherwise the buffer section 280 operates the same as buffer section 28 of FIG. 1.

Buffer section 270, which provides the compensated reference signal on line 180, is always on in the currently preferred embodiment. Since the signal on line 180 is coupled to all the buffer sections such as section 280 it is more practical to have it on continually. Even though section 270 is not deactivated by the select signal, it includes the same size transistors as used in section 280 to assure that section 270 has the same characteristics as section 280. For instance, p-channel transistors 48 and 49 corresponding to transistors 28 and 39 are coupled in series with the feedback transistor 160. The gate of transistor 48 is coupled to receive the reference signal on line 100. P-channel transistor 50 which is of identical size to transistor 40 is coupled in series with transistor 140. An n-channel transistor 51 is coupled between node 190 and ground. The gates of transistors 49, 50 and 51 are coupled to ground assuring that transistors 49 and 50 continually conduct while transistor 51 is permanently off. (The relatively large transistor 38 is used to assure power cutoff without introducing adverse characteristics to the buffer.)

Buffer section 270 operates the same as section 27 of FIG. 1 even with transistors 48, 49, 50 and 51.

The sizes of the field-effect transistors used in the presently preferred embodiment are shown in FIG. 4. All the transistors are enhancement mode; the p-channel transistors are shown with the letter "P" in FIG. 4. The p-type well for transistor 160 is coupled to line 190, and similarly, the p-type well for transistor 230 is coupled to line 36.

Thus, an MOS buffer has been described which, in its currently preferred embodiment, is fabricated with CMOS technology. The buffer provides extremely stable operation over a wide range of temperatures and process variations.

I claim:

1. In an MOS integrated circuit, a buffer for sensing an input signal which varies above and below a reference potential comprising:

a first circuit coupled to receive said reference potential, said first circuit providing a buffered reference potential;

a first amplifier means for receiving said buffered reference potential at its input;

a feedback path coupling the output of said first amplifier means to said first circuit so as to cause said buffered reference potential to maintain said first amplifier means in a predetermined operating range, said first amplifier means thereby providing a compensated reference potential;

a second circuit, substantially identical to first circuit, coupled to receive said input signal, said second circuit providing a buffered input signal;

a second amplifier means for receiving said buffered input signal at its input and for providing an output signal for said buffer;

an electrical path coupling said compensated reference potential to said second circuit thereby providing a compensated input signal;

whereby a buffer is realized which operates over a wide temperature and process variation range.

2. The buffer defined by claim 1 wherein said buffer is realized with n-channel transistors.

3. The buffer defined by claim 1 wherein said first and second circuits are inverters.

4. The buffer defined by claim 3 wherein said feedback path includes a first field-effect transistor with its gate coupled to said output of said first amplifier means.

5. The buffer defined by claim 1 or claim 3 wherein said first and second amplifier means are inverters.

6. The buffer defined by claim 1 or claim 4 wherein said first and second amplifier means are operating in a region of maximum gain.

7. The buffer defined by claim 1 or claim 4 wherein said first and second amplifier means are operating in a linear region.

8. The buffer defined by claim 4 wherein said reference potential is derived from a voltage divider which is coupled to the power supply potential for said buffer.

9. In an MOS integrated circuit, a buffer for sensing an input signal which varies above and below a reference potential comprising:

a first inverter coupled to receive said reference potential for providing a buffered reference potential;

a second inverter coupled to receive the output of said first inverter;

a first field-effect transistor having its gate coupled to the output of said second inverter and one of its other terminals coupled to the input of said second inverter and to said first inverter, for providing feedback between said input and output of said second inverter;

a third inverter coupled to receive said input signal for providing a buffered input signal;

a fourth inverter coupled to receive the output of said third inverter, the output of said fourth inverter providing the output for said buffer;

a second field-effect transistor having its gate coupled to said output of said second inverter and one of its other terminals coupled to said third inverter and to said input of said fourth inverter, whereby a buffer is realized which operates over a wide temperature and process variation range.

10. The buffer defined by claim 9 wherein the sizes of the transistors of said first inverter are identical to the sizes of the transistors of said third inverter.

11. The buffer defined by claim 10 wherein the size of said first transistors is identical to the size of said second transistor.

12. The buffer defined by claim 11 wherein said buffer is fabricated from n-channel transistors.

13. The buffer defined by claim 12 including p-channel transistors coupled to said first and third inverters and said first and second transistors, said p-channel transistors coupled to said third inverter and said second transistor being coupled to a select line to permit selective conduction through said third inverter and second transistor.

14. The buffer defined by claim 13 wherein said p-channel transistors coupled to said first inverter and said first transistor have their gates permanently coupled to ground.

15. The buffer defined by claim 14 including a first n-channel transistor coupled to said input of said second inverter and a second n-channel transistor coupled to said input of said fourth inverter, and second n-channel transistor for selectively grounding said input of said fourth inverter.

* * * * *